United States Patent [19]

Potter

[11] 4,359,626
[45] Nov. 16, 1982

[54] ELECTRIC BLANKET HEATING CONTROL WITH CAPACITANCE SENSING

[76] Inventor: Bronson Potter, R.F.D. 1, Mason, N.H. 03048

[21] Appl. No.: 188,965

[22] Filed: Sep. 19, 1980

Related U.S. Application Data

[63] Continuation-in-part of Ser. No. 131,527, Mar. 18, 1980, abandoned.

[51] Int. Cl.³ .............................................. H05B 1/02
[52] U.S. Cl. .................................... 219/490; 219/212; 219/499; 219/509
[58] Field of Search ............... 219/490, 494, 501, 499, 219/509, 518, 528, 212, 203; 307/117, 125; 340/562, 563, 573, 640, 655, 310 A, 310 R; 361/56, 45, 44, 46, 47

[56] References Cited

U.S. PATENT DOCUMENTS

| | | | |
|---|---|---|---|
| 2,424,438 | 7/1947 | Downie | 219/518 X |
| 3,296,493 | 1/1967 | Whittaker et al. | 361/45 |
| 3,549,808 | 12/1970 | Smith | 361/56 |
| 3,643,346 | 2/1972 | Lester | 219/400 |
| 3,836,828 | 9/1974 | Siegel | 340/563 |
| 3,883,782 | 5/1975 | Beckwith | 361/57 |
| 4,086,594 | 4/1978 | Kropielnicki et al. | 219/203 |
| 4,216,516 | 8/1980 | Howell | 361/45 |

Primary Examiner—B. A. Reynolds
Assistant Examiner—M. H. Paschall

[57] ABSTRACT

An electric blanket control effective to deactivate power to the blanket's resistance wire heating circuit, the control having a capacitance detector constructed and adapted to respond to differences in the capacitance of the heating circuit attributable to the presence or absence of the user under the heating wire of the blanket, and a switch responsive to the detector adapted to interrupt power to the heating circuit when the capacitance value of the heating circuit indicates the absence of the user.

17 Claims, 4 Drawing Figures

FIG 1
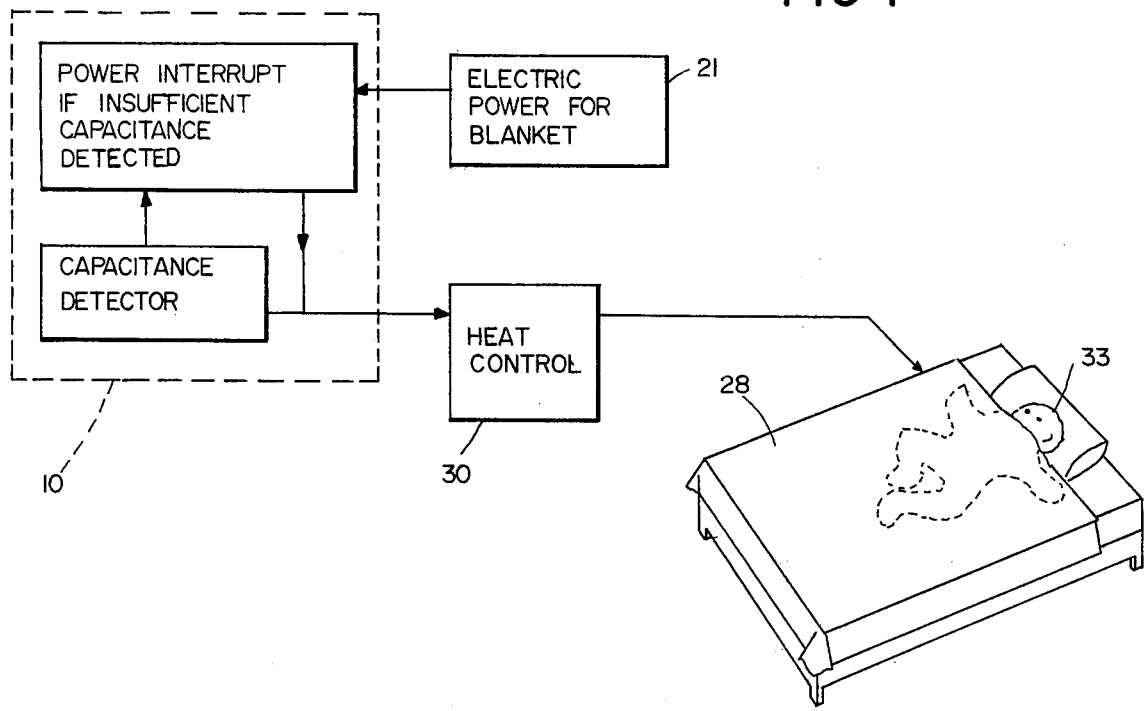
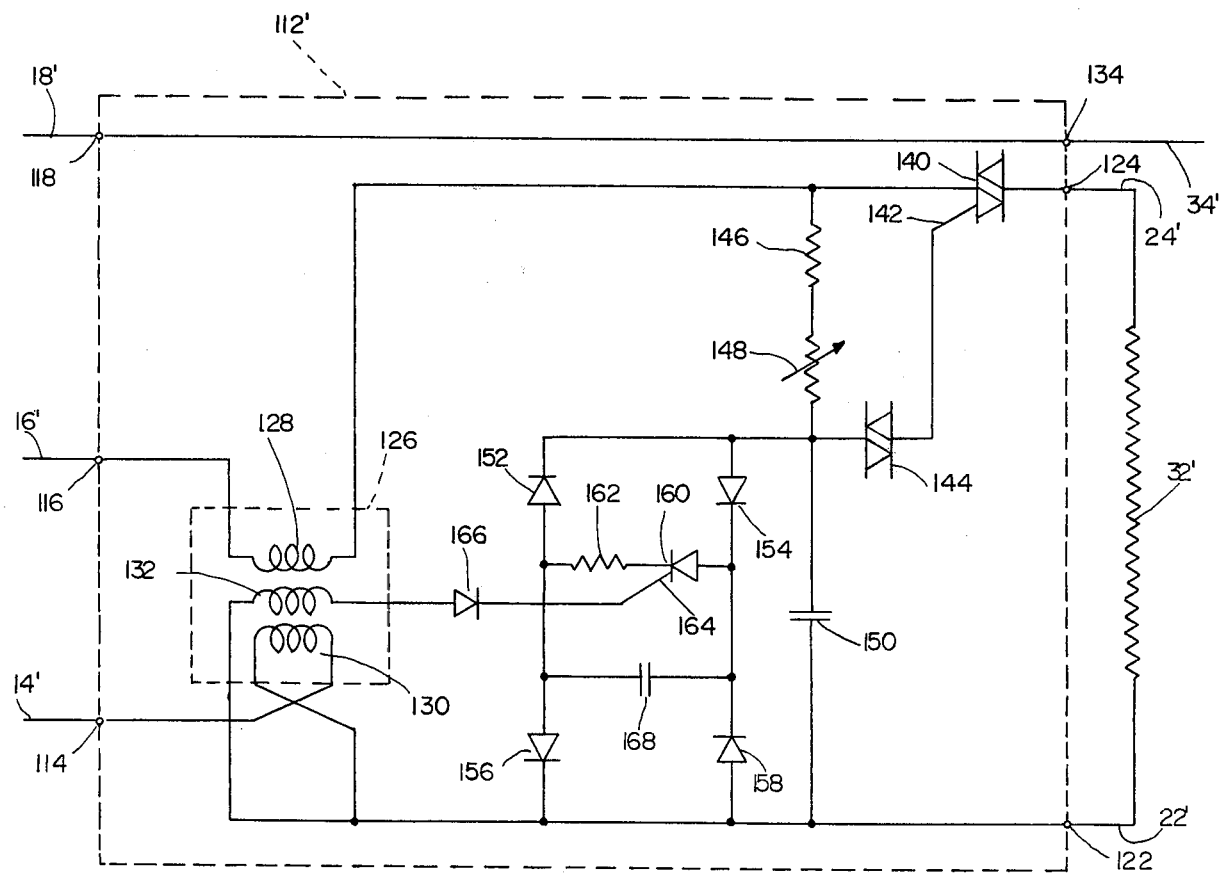
FIG 3

ELECTRIC BLANKET HEATING CONTROL WITH CAPACITANCE SENSING

This application is a continuation-in-part of application Ser. No. 131,527, now abandoned, filed Mar. 18, 1980.

BACKGROUND OF THE INVENTION

This invention relates to safety control devices for use with electric blankets.

People are forgetful, particularly in the drowziness of rising times, and frequently neglect to turn off the electric blanket. Obviously an electric blanket left operating on an unoccupied bed wastes power; more important, if the blanket is thrown off in a pile, multiple folding of the blanket upon itself threatens overheating and fire. Another danger to the user is electrical shock from the blanket through fraying of the wires, spilling of liquids, or penetration of the blanket by metallic objects such as hairpins or eating implements. Children particularly need to be protected from the danger of their meddling with electric blankets.

SUMMARY OF THE INVENTION

The invention features an electric blanket whose resistance wire array heating circuit is deactivated when the blanket is unattended, using a control having a capacitance detector for the heating circuit constructed and adapted to respond to differences in the circuit capacitance attributable to the presence or absence of a user under the heating wire of the blanket, and a switch responsive to the detector adapted to interrupt power to the heating circuit when the capacitance value of the heating circuit indicates the absence of the user.

In preferred embodiments, the capacitance detector has means to apply radio frequency current through the heating wire array, including RF isolation means isolating the array from RF ground, and means for sensing changes in the radio frequency current due to the absence of the user under the heating wire of the blanket; the RF current sensing means includes a resistance-capacitance bridge that includes in one leg the capacitance between the blanket element and the body of the user.

In accordance with another aspect of the invention, there is provided a ground fault interrupter circuit that has a set of input terminals for connection to a power source, a set of output terminals for connection to an electrical load, a semiconductor switch in series between an input terminal and an output terminal for controlling supply of electrical power to an electrical load connected to the output terminals, a detector for sensing current flow at the output terminals, and means responsive to detection by the detector of a difference in current flow at the output terminals to operate the semiconductor switch and deenergize the load connected to the output terminals. In one embodiment the differential detector includes a differential transformer while in another embodiment, the differential detector includes a resistance bridge network.

In a particular embodiment the electric blanket control includes ground fault interrupter means to protect the user from electrical injury in case of insulation fault; further, imbalance in the bridge due to user absence induces a current in a switching circuit sufficient to stimulate a ground fault, thus causing the ground fault interrupter to terminate current flow to the heating circuit; the blanket includes means for delaying interruption of power to the heating circuit in response to the capacitance detector, and a resettable alarm activated by the capacitance detection switch.

In a particular ground fault interrupter circuit, a semiconductor switch control circuit includes voltage responsive means for controlling triggering of the semiconductor switch into conduction, and override means for preventing the semiconductor switch from being triggered into conduction that includes a diode bridge network with a capacitor of the voltage responsive means connected across its output terminals, and a semiconductor switch responsive to the detector for preventing charging of the capacitor in response to a predetermined output from the detector.

Other features and advantages of the invention will be seen as the following description of particular embodiments progresses.

DESCRIPTION OF THE PARTICULAR EMBODIMENTS

I turn now to a description of particular embodiments, after first briefly describing the drawings.

FIG. 1 is a block diagram view of the preferred embodiment of the invention.

FIG. 3 is a schematic diagram of a ground fault interrupter circuit suitable for use in the circuit of FIG. 2.

Figure 2:
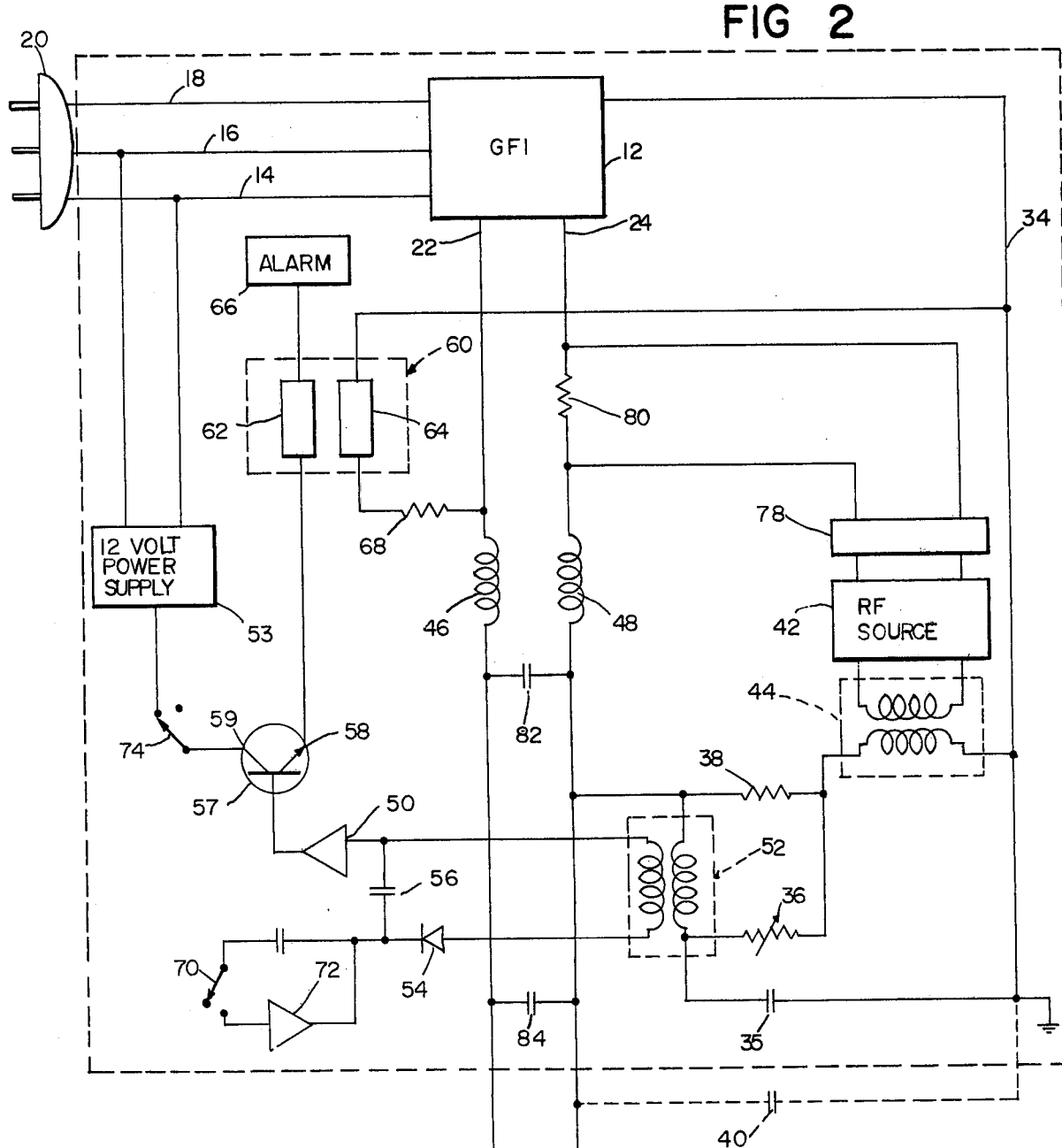
FIG. 2 is a detailed schematic of the embodiment of FIG. 1.

Referring to FIGS. 1 and 2, electric blanket control 10 is provided with a latching ground fault interrupter (GFI) switch 12 (e.g., Leviton 6199I or a semiconductor switch circuit of the type shown in FIG. 3) having line voltage inputs, active, neutral and ground 14, 16, and 18 respectively, connected via a standard three-pronged, grounded electrical plug 20, through which standard outlet AC current from source 22 is supplied to control 10. GFI switch 12 provides standard AC current, through lines 24 and 26, to power a standard electric blanket 28 having electrical control 30 and a heating element 32. GFI switch 12, which also provides a ground line 34, acts such that, should the circuit formed by lines 24, 26 and the electric blanket became grounded (e.g., as for example, by a child contacting an exposed portion of heating element 32 ), GFI switch 12 will, by internally short circuiting lines 14 and 16, interrupt current flow through lines 24 and 26.

Additionally, blanket control 10 is provided with a radio frequency bridge and its associated driving and sensing circuitry, to measure the capacitance of which heating element 32 forms one plate and conductive objects adjacent to element 32, i.e., the human body 33, form the other plate. To this end, capacitor 35 and rheostat 36, connected in series, serve as one leg of the bridge, while resistor 38 and the capacitance (shown in phantom and indicated by reference numeral 40) formed by element 32 and its surrounding objects, also connected in series, serve as the other leg.

As RF source 42 acts to induce, through RF transformer 44, RF current in the circuit formed by the bridge, that bridge having resistor 38 and phantom capacitor 40 in one leg and balancing resistor 36 and capacitor 35 in the other leg. RF chokes 46 and 48 isolate GFI switch 12 from the RF current induced.

Amplifier 50 reads, through RF transformer 52, the current flow between the two bridge legs. Any current flow from transformer 52 is half-wave rectified and smoothed by diode 54 and capacitor 56.

In use, rheostat 35 is adjusted so that, when the person 33 who is to be using the device is lying beneath the electric blanket, and thus in close proximity to heating element 32, the RF capacitive impedance 40 provided by the combination of heating element 32, the person's body 33 and any other proximate grounded conductors (e.g., box springs, etc.) will serve to balance the bridge and prevent current flow to amplifier 50. If, on the other hand, such person removes himself or herself from the proximity of heating element 32, the impedance of the capacitance 40 will be drastically reduced, throwing the bridge out of balance and causing current flow to amplifier 50. Rheostat 36 may be adjusted to maintain bridge balance according to the size and weight of the user and the conditions of the surrounding environment.

Current from amplifier 50, indicating the absence of the user, is employed as follows.

A 12 V DC power supply 53, which draws current from power lines 14 and 16, provides current to the emitter terminal 59 of an NPN transistor 57. Transistor 57, when activated by current from amplifier 50, will pass current from its emitter terminal 58 to activate a relay circuit 60, made up of a latching relay 62 and a non-latching relay 64. Closing of latching relay 62 activates an alarm 66, whereas closing of non-latching relay 64 connects power line 22 to panel ground line 34 through a resistor 68, thus effectively grounding line 22 and triggering GFI circuit 12 to terminate power to the electric blanket 28.

Pressing a delay button 70 activates a standard 555 timer 72, to forestall activation of relays 62 and 64 by approximately five minutes, thus allowing the user to leave the bed or preheat the bed for a short time without terminating power to the electric blanket 28 or sounding alarm 66. Additionally, a reset button 74 permits the user to reset latching relay 62 to an open position, once he has returned to the blanket, and thereby silence alarm 66.

An RF source enabling device 78 is connected to both ends of a resistor 80, thus ensuring that RF source 42, and thus the body capacitance detector bridge, is activated only if the electric blanket is switched on (i.e., at control 30).

Capacitors 82 and 84 maintain heating element 32 at a uniform RF potential.

Figure 4:
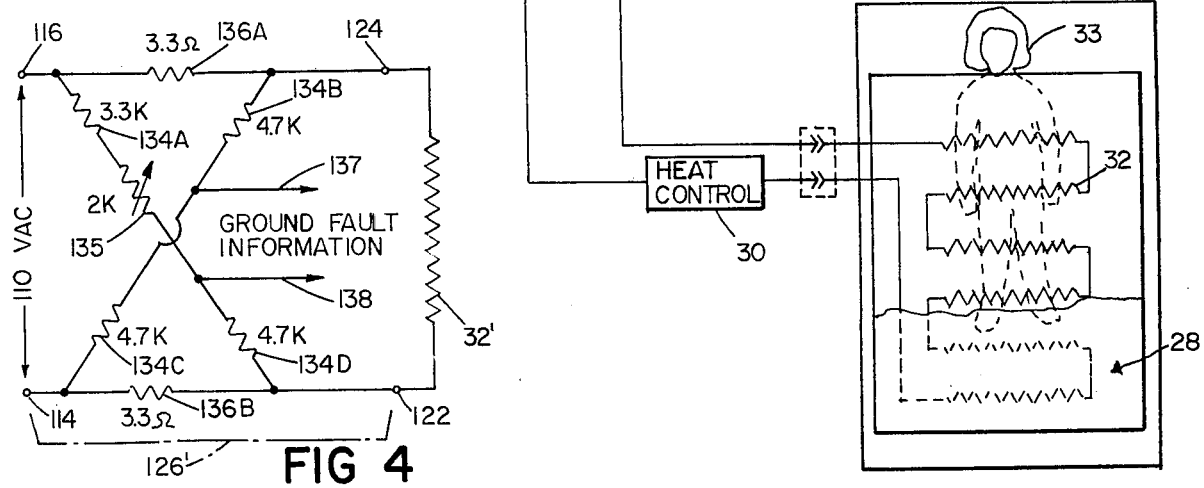
FIG. 4 is a schematic diagram of a differential current flow detector suitable for use in the ground fault interrupter of FIG. 3.

A ground fault interrupter circuit suitable for use in the control system shown in FIG. 2 is shown in FIG. 3. The ground fault interrupter 112 has terminals 114, 116 for connection to power lines 14', 16'. Differential transformer 126 has monitoring windings 128 and 130 connected in opposed relation and a sensing winding 132. (Other differential current flow detectors may be used in place of differential transformer 126, for example, a resistive bridge network of the type shown in FIG. 4. That network 126' includes bridge resistors 134 A, B, C and D, adjustable resistor 135 and series resistors 136 A, B. The outputs on lines 137, 138 are balanced by adjustment of resistor 135. A ground fault on either line connected to resistor load 32' produces significant differences in current flow at terminals 122, 124 and creates a bridge unbalance which is signaled as ground fault information over lines 137 138.) A semiconductor control switch triac 140 is connected in series with winding 128 between terminals 116 and 124. Similarly winding 132 is connected in series with winding 128 between input terminal 114 and output terminal 124. The load, in this case electrical resistance element 32' of the electric blanket, is connected across terminals 122, 124, together with other components of the monitoring circuit of FIG. 2. Connected to the control electrode 142 of triac 140 via diac 144 is a voltage divider network that includes fixed resistor 146, adjustable resistor 148, and capacitor 150. Connected across capacitor 150 is a full wave diode bridge network that includes diodes 152, 154, 156 and 158; and connected across the diode bridge is a switch circuit that includes SCR 160 and a current limiting resistor 162. The control electrode 164 of SCR 160 is connected through diode 166 to sensing winding 132 of differential transformer 126. Filter capacitor 168 connected across the bridge rectifier network functions to prevent SCR 160 from dropping out of conduction at zero crossings. In each half cycle of power applied at terminals 114, 116, as soon as capacitor 150 is charged to thirty-two volts, diac 144 is triggered and fires triac 140 to pass current to resistive load 32'. The change in resistance of the electric blanket wire during heating is relatively low as it is relatively cool (compared to the temperature of the incandescent filament of a lightbulb). Adjustable resistor 148 may be varied to adjust the duration of the heating current pulses. Sensing winding 132 of differential transformer 126 produces an output which triggers SCR 160 into conduction when there is a significant difference in the current flow through windings 128, 130 (the line supplying the resistive load 32'). Thus, a ground fault condition created by relay 64 (FIG. 2) triggers SCR 160 and prevents charging of capacitor 150 so that diac 144 will not be triggered. Power flow to load 32' (and to auxiliary outlets 76) therefore terminates.

Other embodiments are within the following claims.

What is claimed is:

1. An electric blanket control for use with a blanket having an electrical heating circuit that includes an electrical resistance wire array in an expanse of blanket, the control effective to deactivate power to the heating circuit when the blanket is unattended, said control comprising means for applying electric power to said resistance wire array to generate heat in said expanse of blanket, a capacitance detector for said heating circuit, said capacitance detector being arranged for connection to said resistance wire array and constructed and adapted to respond to differences in the capacitance of the heating circuit attributable to the presence or absence of the user under the heating wire of the blanket, and switch means responsive to said capacitance detector adapted to interrupt power flow to said heating circuit when the capacitance value of the heating circuit indicates the absence of the user under the heating wire of the blanket.

2. The electric blanket control of claim 1 wherein said capacitance detector comprises means to apply radio frequency current through the blanket resistance wire array and means sensing change in the radio frequency current due to the absence of the user under the heating wire of the blanket.

3. The electric blanket control of claim 2 wherein the means to apply radio frequency current includes RF isolation means isolating the blanket array from RF ground.

4. The electric blanket control of claims 2 or 3 wherein the means for sensing RF current comprises a resistance-capacitance bridge formed in part by the capacitance value of said heating circuit.

5. The electric blanket control of claim 1 wherein said control is connected to means for interrupting current to said heating circuit when said circuit is grounded.

6. The electric blanket control of claim 5 wherein said current interrupting means includes a ground fault interrupter circuit that has a set of input terminals for connection to a power source, a set of output terminals for connection to an electrical resistance wire array, a semiconductor switch in series between an input terminal and an output terminal for controlling supply of electrical power to said electrical resistance wire array, a sensor for sensing current flow at said output terminals, and means responsive to detection by said current flow sensor of a difference in current flow at said output terminals to operate said semiconductor switch and deenergize said resistance wire array connected to said output terminals.

7. The circuit of claim 6 wherein said interrupter circuit includes a differential transformer that has first and second monitoring windings, said first monitoring winding being connected to sense current flow between a first input terminal and a first output terminal and said second monitoring winding being connected to sense current flow between a second input terminal and a second output winding, and a sensing winding responsive to a difference in current flows through said monitoring windings.

8. The circuit of claim 6 wherein said interrupter circuit includes a resistance bridge network arranged to produce an output in response to a difference in current flows at the output terminals of said bridge network.

9. The circuit of any one of claims 6, 7 or 8 and further including a semiconductor switch control circuit that includes voltage responsive means for controlling triggering of said semiconductor switch into conduction, and means to override said voltage responsive means and prevent said semiconductor switch from being triggered into conduction.

10. The circuit of claim 9 wherein said voltage responsive means includes a capacitor, and said override means includes a diode bridge network with said capacitor connected across its output terminals, and a semiconductor switch responsive to said detector for preventing charging of said capacitor in response to a predetermined output from said detector.

11. The circuit of claim 9 wherein said semiconductor switch is a triac.

12. The electric blanket control of claim 2 wherein said control is connected to means for interrupting current to said heating circuit when said circuit is grounded and said RF sensing means responds to said change in RF current by causing current to be drawn at a point in circuit between said interrupting means and said resistance wire array, said current draw being of sufficient size to cause said means to interrupt current to said heating circuit.

13. The electric blanket control of claim 1 wherein said control further comprises means for delaying the interruption of said power to said heating circuit in response to said capacitance detector.

14. The electric blanket control of claim 1 wherein said control includes an alarm to warn the user, said alarm being activated by said switch means, and a reset means to silence said alarm.

15. In combination, an electric blanket and control therefor, said blanket having an electrical heating circuit that includes an electrical resistance wire array in an expanse of blanket, means for connecting said resistance wire array to a power source, means connected in circuit between said power source connecting means and said resistance wire array for interrupting current to said heating circuit when said circuit is grounded, said control effective to deactivate power to the heating circuit when the blanket is unattended, said control comprising a capacitance detector connected to said resistance wire array and responsive to differences in capacitance of the heating circuit attributable to the presence or absence of the user under the heating wire of the blanket, means to apply radio frequency current through said resistance wire array, means for sensing change in radio frequency current due to the absence of the user under the resistance wire array of said blanket, comprising a resistance-capacitance bridge formed in part by said resistance wire array, RF isolation means for isolating said resistance wire array from RF ground, and switch means responsive to said capacitance detector adapted to interrupt power flow to said heating circuit when the capacitance value of the heating circuit indicates the absence of the user under the heating wire of said blanket, said switch means being connected, upon activation, to draw current at a point in the circuit between said current interrupting means and said resistance wire array, said current draw being of sufficient size to cause said current interrupting means to terminate flow of current to said heating circuit.

16. The combination of claim 15 wherein said current interrupting means includes a ground fault interrupter circuit that has a set of input terminals for connection to a power source, a set of output terminals for connection to an electrical resistance wire array, a semiconductor switch in series between an input terminal and an output terminal for controlling supply of electrical power to said electrical resistance wire array, a detector for comparing current flows at said output terminals, and means responsive to detection by said detector of a difference in current flow at said output terminals to operate said semiconductor switch and deenergize said resistance wire array connected to said output terminals.

17. The combination according to claim 16 wherein said semiconductor switch is a triac, and further including a triac control circuit that includes voltage responsive means for controlling triggering of said triac into conduction, and override means for preventing said triac from being triggered into conduction, said override means including a diode bridge network with a capacitor of said voltage responsive means connected across its output terminals, and a second semiconductor switch responsive to said detector from preventing charging of said capacitor in response to a predetermined output from said detector.

* * * * *